US012603252B2

(12) United States Patent
Cardona et al.

(10) Patent No.: US 12,603,252 B2
(45) Date of Patent: Apr. 14, 2026

(54) LOW-FLOW RADICAL GAS GEOMETRICAL CONTROL THROUGH TWO-DIMENSIONAL COMPRESSION BETWEEN PLASMA SOURCE AND CHEMICAL REACTOR

(71) Applicant: Applied Materials, Inc., Santa Clara, CA (US)

(72) Inventors: Edy Cardona, Fremont, CA (US); Eric Kihara Shono, San Mateo, CA (US); Martin John Ripley, San Jose, CA (US); Hansel Lo, San Jose, CA (US); Christopher S. Olsen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 62 days.

(21) Appl. No.: 18/805,721

(22) Filed: Aug. 15, 2024

(65) Prior Publication Data

US 2026/0051460 A1    Feb. 19, 2026

(51) Int. Cl.
| | |
|---|---|
| *H05H 1/24* | (2006.01) |
| *H01J 37/32* | (2006.01) |
| *H05H 1/34* | (2006.01) |
| *H05H 1/40* | (2006.01) |
| *H05H 1/54* | (2006.01) |

(52) U.S. Cl.
CPC ................................ *H01J 37/3244* (2013.01)

(58) Field of Classification Search
None
See application file for complete search history.

(56) References Cited

U.S. PATENT DOCUMENTS

| | | | | |
|---|---|---|---|---|
| 7,486,758 | B1 * | 2/2009 | Turchi | ..................... G21B 1/00 |
| | | | | 315/111.41 |
| 9,596,745 | B2 * | 3/2017 | Laberge | ................... G21B 1/00 |
| 11,049,696 | B2 | 6/2021 | Pandey et al. | |
| 11,501,954 | B2 | 11/2022 | Pandey et al. | |
| 2002/0073925 | A1 | 6/2002 | Noble et al. | |
| 2003/0124820 | A1 | 7/2003 | Johnsgard et al. | |
| 2006/0228496 | A1 | 10/2006 | Choi et al. | |

(Continued)

OTHER PUBLICATIONS

International Search Report and Written Opinion for PCT/US2025/036889 dated Nov. 9, 2025.

*Primary Examiner* — Kenneth B Wells
(74) *Attorney, Agent, or Firm* — Patterson + Sheridan, LLP

(57) ABSTRACT

The present disclosure generally relates to a processing system comprising a flow assembly for processing thin substrates using low flow rates. The flow assembly comprises at least one compression part configured to compress a volume occupied by gas radicals flowing at a rate of about 0.1 slm to 5 slm from a plasma source to a chamber in two dimensions. The at least one compression part compresses the volume occupied by the gas radicals about 50% to about 90% from an initial cross-sectional area of the port of the process chamber. In some embodiments, the at least one compression part is a two compression parts, where a first compression part coupled to the port of the process chamber is larger in volume than a second compression part coupled to the first compression part and the chamber. In such an embodiment, the first and second compression parts are removable.

20 Claims, 7 Drawing Sheets

(56) References Cited

U.S. PATENT DOCUMENTS

2010/0130911 A1* 5/2010 Morfill ..................... A61L 2/14
                                                606/41
2014/0079376 A1   3/2014 Tseng et al.
2018/0148842 A1   5/2018 Matsumoto et al.
2019/0228951 A1   7/2019 Pandey et al.

\* cited by examiner

208

210

202

224b

224

224a

202 x y

225

Z

Y

X

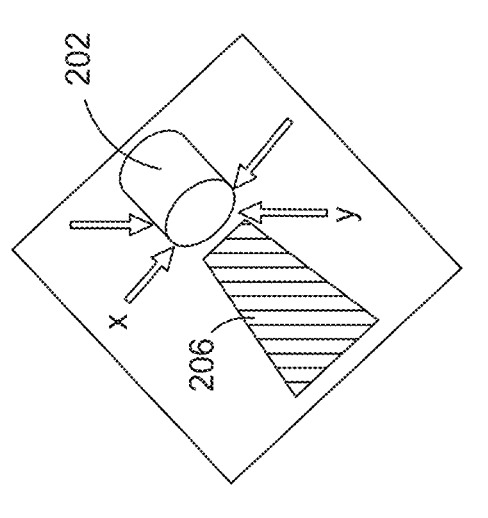
FIG. 3B
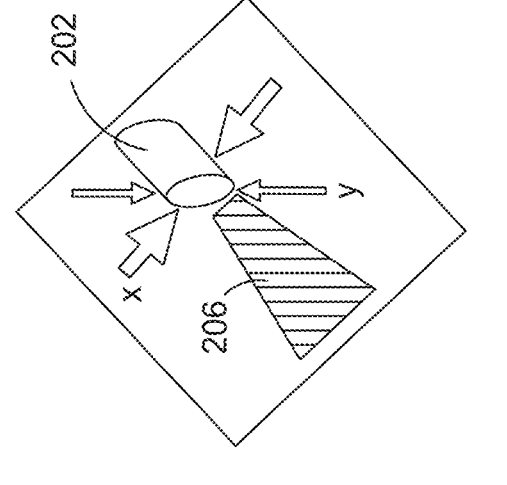
FIG. 3C
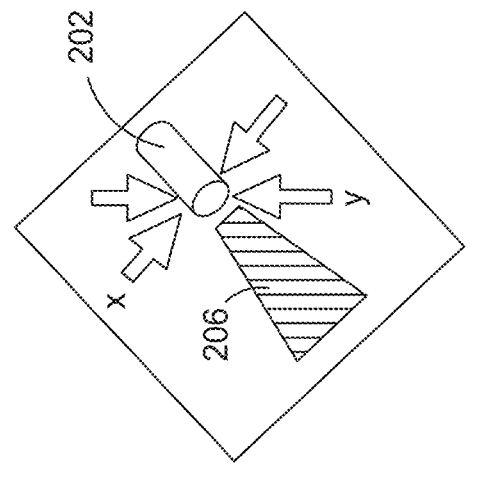
FIG. 3A
FIG. 3D

LOW-FLOW RADICAL GAS GEOMETRICAL CONTROL THROUGH TWO-DIMENSIONAL COMPRESSION BETWEEN PLASMA SOURCE AND CHEMICAL REACTOR

BACKGROUND

Field

Embodiments of the present disclosure generally relate to semiconductor device fabrication and in particular to a flow assembly for processing thin substrates, such as wafers, using low flow rates.

Description of the Related Art

The production of silicon integrated circuits has placed difficult demands on fabrication operations to increase the number of devices while decreasing the minimum feature sizes on a chip. Additionally, increased cost pressure on device fabricators creates the need to increase throughput at semiconductor manufacturing facilities. As a result, semiconductor manufacturing processes should perform film formation and modification operations at high speed with extreme uniformity. Moreover, as technology progresses, substrates such as wafers are continually becoming thinner. If thin substrates are processed using gas having a high flow rate, non-uniformity requirements often cannot be met.

Therefore, an improved apparatus and method for processing thin substrates with a low flow rate is needed.

SUMMARY

The present disclosure generally relates to a processing system comprising a flow assembly for processing thin substrates using low flow rates. The flow assembly comprises at least one compression part configured to compress gas radicals flowing at a rate of about 0.1 slm to 5 slm from a plasma source to a chamber in two dimensions. The at least one compression part compresses the gas radicals about 50% to about 90% from an initial cross-sectional area of the port of the process chamber. In some embodiments, the at least one compression part is two compression parts coupled together, where a first compression part coupled to the port of the process chamber has a greater cross sectional area orthogonal to a direction of gas flow than a second compression part coupled to the first compression part and the chamber. In such an embodiment, the first and second compression parts are removable or replaceable.

In one embodiment, a flow assembly extends between a plasma source and a chamber, the flow assembly comprising a first compression part having a first opening coupled to a port of the plasma source and a second opening opposite the first opening, the second opening being smaller than the first opening, and a second compression part having a first opening coupled to the second opening of the first compression part and a second opening opposite the first opening coupled to the chamber, the second opening of the second compression part being smaller than the first opening of the second compression part, wherein the first and second compression parts are configured to compress a volume occupied by gas radicals flowing from the plasma source to the chamber in two dimensions.

In another embodiment, a processing system comprises a plasma source, a chamber, and a flow assembly extending between the plasma source and the chamber, the flow assembly comprising: a first compression part having a first opening coupled to a port of the plasma source and a second opening opposite the first opening, the second opening being smaller than the first opening, and a second compression part having a first opening coupled to the second opening of the first compression part and a second opening opposite the first opening coupled to the chamber, the second opening of the second compression part being smaller than the first opening of the second compression part, wherein the first and second compression parts are configured to compress a volume occupied by gas radicals flowing from the plasma source to the chamber in two dimensions.

In yet another embodiment, a processing system comprises a plasma source, a chamber, and a flow assembly extending between the plasma source and the chamber, the flow assembly comprising: a first compression part having a first opening coupled to a port of the plasma source and a second opening opposite the first opening, the second opening being smaller than the first opening, and a second compression part having a first opening coupled to the second opening of the first compression part and a second opening opposite the first opening coupled to the chamber, the second opening of the second compression part being smaller than the first opening of the second compression part, wherein the second opening of the first compression part and the first opening of the second compression part have a same size, and wherein the first and second compression parts are configured to compress a volume occupied by gas radicals flowing at a rate of about 0.1 slm to 5 slm from the plasma source to the chamber in two dimensions.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of scope, for the disclosure may admit to other equally effective embodiments.

FIGS. 3A-3D illustrate the compression tunability of gas radicals using one or more flow assemblies in FIGS. 2A-2D, according to various embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Figure 1A:
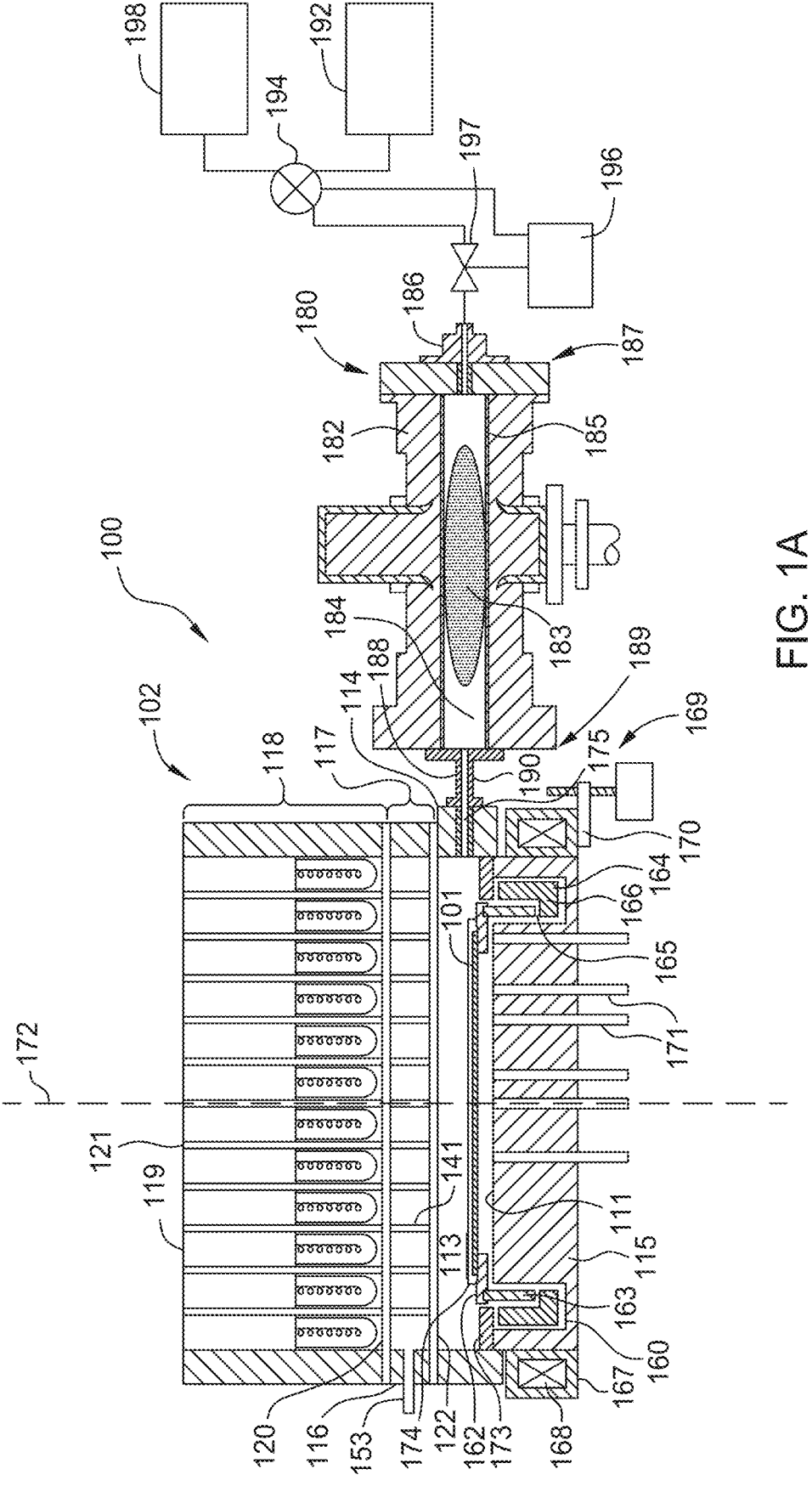
FIG. 1A is a schematic of a processing system, according to one or more embodiments described and discussed herein.

FIG. 1A illustrates a substrate processing system 100 that includes a thermal processing chamber 102 and a precursor activator 180 that couples to the thermal processing chamber 102. In one aspect, the precursor activator is a plasma generator located remotely from the processing region 113 of the thermal processing chamber 102 on a flowline used to introduce one or more process gases to the processing region 113, whereby a plasma is formed of the gas passing through the activator ionizing at least a portion of the gas species passing therethrough. Because the energy supporting the gas in a plasma state exists only in the precursor activator 180, the precursor gas enters the processing volume of the chamber in an activated, yet non-plasma state, including therein a high percentage of radical species of the precursor gas, here an activated gas mixture. The precursor activator 180 can also be used to provide an activated gas mixture without using a plasma, for example by applying energy to a gas, which energy does not significantly ionize the gas. The thermal processing chamber 102 has a processing region 113 into which the activated precursor gas is introduced, and which is enclosed by one or more side walls 114 (e.g., four side walls) and a base 115. The upper portion of side wall 114 may be sealed to a window assembly 117 (e.g., using "0" rings). Here, a radiant energy assembly 118 is positioned over and coupled to window assembly 117. The radiant energy assembly 118 has a plurality of lamps 119, which may be tungsten halogen lamps, each mounted into a receptacle 121 and positioned to emit electromagnetic radiation into the processing region 113. The window assembly 117 of FIG. 1A has a plurality of light pipes 141 (e.g., short light pipes), but the window assembly 117 may just have a flat, solid window with no light pipes therein. The window assembly 117 has an outer wall 116 (e.g., a cylindrical outer wall) that forms a rim enclosing the window assembly 117 around a circumference thereof. The window assembly 117 also has a first window 120 covering a first end of the light pipes 141 and a second window 122 covering a second end of the light pipes 141, opposite the first end. The first window 120 and second window 122 extend to, and engage with, the outer wall 116 of the window assembly 117 to enclose and seal the interior of the window assembly 117, which includes the light pipes 141. In such cases, when light pipes are used, a vacuum can be produced in the plurality of light pipes 141 by applying vacuum through a conduit 153 through the outer wall 116 to one of the light pipes 141, which is in turn fluidly connected to the rest of the pipes.

A substrate 101 is supported in the thermal processing chamber 102, here by a support ring 162 within the processing region 113. The support ring 162 is mounted on the top of a rotatable cylinder 163. By rotating the rotatable cylinder 163, the support ring 162 and substrate 101 are caused to rotate during processing. The base 115 of the thermal processing chamber 102 has a reflective surface 111 for reflecting energy onto the backside of the substrate 101 during processing. Alternatively, a separate reflector (not shown) can be positioned between the base 115 of the thermal processing chamber 102 and the support ring 162. The thermal processing chamber 102 may include a plurality of temperature probes 171 disposed through the base 115 of the thermal processing chamber 102 to detect the temperature of the substrate 101. In the event a separate reflector is used, as described above, the temperature probes 171 also extend through the separate reflector for optical access to electromagnetic radiation coming from the substrate 101.

The rotatable cylinder 163 is supported by a magnetic rotor 164, which is a cylindrical member having a ledge 165 on which the rotatable cylinder 163 rests when both members are installed in the thermal processing chamber 102. The magnetic rotor 164 has a plurality of magnets in a magnet region 166 below the ledge 165. The magnetic rotor 164 is disposed in an annular well 160 located at a peripheral region of the thermal processing chamber 102 along the base 115. A cover 173 rests on a peripheral portion of the base 115 and extends over the annular well 160 toward the rotatable cylinder 163 and support ring 162, leaving a tolerance gap between the cover 173 and the rotatable cylinder 163 and/or the support ring 162. The cover 173 generally protects the magnetic rotor 164 from exposure to process conditions in the processing region 113.

The magnetic rotor 164 is rotated by coupling to a rotating magnetic field from a magnetic stator 167 disposed around the base 115. The magnetic stator 167 has a plurality of electromagnets 168 that, during processing of the substrate 101, are powered according to a rotating pattern to form a rotating magnetic field that provides a rotating magnetic field which couples to the magnets in the magnetic rotor 164 to cause the magnetic rotor 164 to rotate. The magnetic stator 167 is coupled to a linear actuator 169, which in this case is a screw-drive, by a support 170. Turning the linear actuator 169 mechanically moves the magnetic stator 167 along an axis 172 of the thermal processing chamber 102, which in turn moves the magnetic rotor 164, the rotatable cylinder 163, the support ring 162, and the substrate 101 along the axis 172.

Processing gas is provided to the processing region 113 of the thermal processing chamber 102 through a chamber inlet 175, and is exhausted from the processing region 113 through a chamber outlet oriented out of the page of FIG. 1A and generally along the same plane as the chamber inlet 175 and the support ring 162 (not shown in FIG. 1A). Substrates enter and exit the thermal processing chamber 102 through an access port 174 formed in the side wall 114 and shown at the rear in FIG. 1A.

The precursor activator 180 has a body 182 surrounding an interior space 184 where a plasma 183 of ions, radicals, and electrons can be formed by application of plasma formation energy. A liner 185 made of quartz or sapphire protects the body 182 from chemical attack by the plasma. The interior space 184 preferably does not have any electrical potential gradient present. A gas inlet 186 is disposed at a first end 187 of the body 182 and opposite from a gas outlet 188 that is located at a second end 189 of the body 182. When the precursor activator 180 is coupled to the thermal processing chamber 102, the gas outlet 188 is in fluid communication with the thermal processing chamber 102 through a delivery line 190 to chamber inlet 175, such that radicals of the activated precursor mixture within the plasma 183 generated within the interior space 184 are supplied to the processing region 113 of the thermal processing chamber 102. The gas outlet 188 may have a diameter greater than the diameter of the gas inlet 186 to allow the excited radicals to be efficiently discharged at a desired flow rate, and to minimize the contact between the radicals and the liner 185. If desired, a separate orifice may be inserted within the liner 185 at the gas outlet 188 to reduce an inner dimension of the interior space 184 at the gas outlet 188. The diameter of the gas outlet 188 (or orifice, if used) can be selected to provide a pressure differential between the processing region 113 and the precursor activator 180. The pressure differential may be selected to yield a composition of radicals and molecules flowing in to the thermal processing chamber 102 that is suitable for processes being performed in the thermal processing chamber 102.

To provide gas for plasma processing in the processing region 113, one or more gas sources 192 are coupled to the gas inlet 186 of the precursor activator 180 through a first input of a three-way valve 194 and a valve 197 used to control the flow rate of gas released from the gas source 192. A second input of the three-way valve 194 may be coupled to a second gas source 198. Each of the first and second gas sources 192 and 198 may be, or include, one or more of a nitrogen-containing gas, an oxygen-containing gas, a silicon-containing gas, or a gas such as argon or helium. A valve controller 196 is connected to the three-way valve 194 to switch the valve between its different positions, depending upon which process is to be carried out. The valve controller 196 also controls switching of the three-way valve 194.

The precursor activator 180 is coupled to an energy source (not shown) to provide an excitation energy, such as an energy having a microwave or RF frequency, to the precursor activator 180 to activate the process gas traveling from the gas source 192 into the activated precursor mixture within the plasma 183. In the case where nitrogen-containing gas, for example, $N_2$, is used, the activation in precursor activator 180 produces N* radicals, positively charged ions such as $N_+$ and $N_{2+}$, and electrons in the interior space 184. By locating the precursor activator 180 remotely from the processing region 113 of the thermal processing chamber 102, exposure of the substrate to ions can be minimized. Ions can damage sensitive structures on a semiconductor substrate, whereas radicals are more highly reactive than non-radical molecules of the same gas, and are used to perform beneficial chemical reactions. Use of a precursor activator such as the precursor activator 180 provides for exposure of the substrate 101 to radicals and minimizes exposure of the substrate 101 to ions.

Figure 1B:
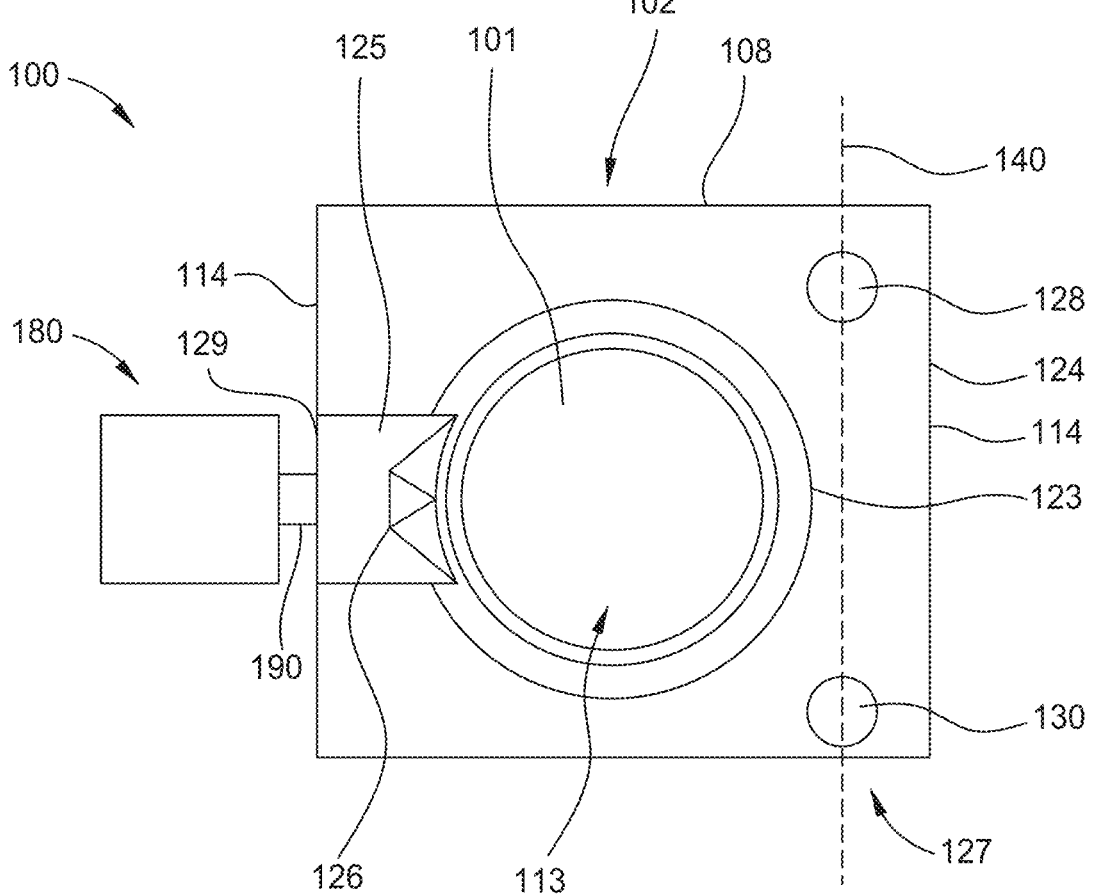
FIG. 1B is a schematic top view of a portion of the processing system illustrated in FIG. 1A, according to one or more embodiments described and discussed herein.

FIG. 1B is a schematic top view of a portion of the substrate processing system 100 according to embodiments described herein. The substrate processing system 100 includes the thermal processing chamber 102 and the precursor activator 180, omitted for clarity is the window assembly 117. The precursor activator 180 may be any suitable precursor activator, such as a microwave coupled plasma source, that operates at a power, for example, of about 6 kW. The precursor activator 180 is coupled to the thermal processing chamber 102 to flow gas formed in the precursor activator 180 toward the thermal processing chamber 102. The precursor activator 180 is coupled to the thermal processing chamber 102 via the delivery line 190. As the gas reaches the plasma generation region, the gas is excited to form a plasma. Downstream from the plasma generation region gas neutrals, gas ions, and gas radicals flow from the plasma generation region towards the exhaust. Gas radicals formed in the precursor activator 180, and gas neutrals flow through the delivery line 190 into the thermal processing chamber 102 during processing of the substrate 101.

The chamber body 108 has an exterior surface, such as the side wall 114, and an interior surface 123. The interior surface 123, in part, defines the processing region 113, in which the substrate 101 is disposed for processing. The interior surface 123 may have a shape similar to the shape of the substrate 101 being processed in the thermal processing chamber 102, in this case circular. The exterior profile 124 may be rectangular, square, or other suitable shape. In one or more embodiments, the chamber body 108 includes a fluid flow body that provides the interior surface 123.

The thermal processing chamber 102 has a distributed pumping structure 127 to remove process gases from the thermal processing chamber 102. Here, two pumping ports 128, 130 are provided adjacent to the second side or side wall 114 of the chamber body 108 to adjust the flow of radicals from a flow assembly 125 to the pumping ports. The two pumping ports 128, 130 are spaced from each other along a line 140 perpendicular to the gas flow path direction at the side wall 114 of the chamber body 108. In other embodiments, the line 140 is not perpendicular to the gas flow path direction, and the line 140 may form an acute or obtuse angle with respect to the gas flow path direction. Other embodiments can have two or more pumping ports, that are not arranged along a line but may be distributed in a region near the second side or side wall 114 to provide a distributed pumping structure.

The flow assembly 125 is disposed in the chamber inlet 175 (e.g., a gas flow conduit) extending through the side wall 114 of the chamber body 108, from the exterior surface or side wall 114 to the interior surface 123, for radicals to flow from the precursor activator 180 to the processing region 113 of the thermal processing chamber 102. The flow assembly 125 is fabricated from a material such as quartz or silica, in order to reduce interaction with process gases, such as oxygen radicals. In embodiments for use with nitrogen radicals, the flow assembly 125 can be made from nitridation resistant material, such as silicon nitride. The flow assembly 125 is designed to reduce flow constriction of radical flowing to the thermal processing chamber 102. The flow assembly 125 includes a flow divider 126 to adjust fluid flow from the central area of the conduit 129 toward the periphery thereof.

FIGS. 2A-2D illustrate various flow assemblies 200, 225, 250, 275, according to various embodiments. Each flow assembly 200, 225, 250, 275 may independently be the flow assembly 125 of FIGS. 1A-1B. Each flow assembly 200, 225, 250, 275 may be utilized in the processing system 100 of FIG. 1A. Aspects of the flow assemblies 200, 225, 250, and 275 may be used in combination with one another. Furthermore, the flow assemblies 200, 225, 250, and 275 may comprise other components or parts not shown or discussed below.

Each flow assembly 200, 225, 250, 275 is configured to compress gas radicals 202 in two dimensions, such as in x-direction and in the y-direction, when processing thin substrates 210 using low flow rates of about 0.1 slm to about 5 slm and a pressure from about 0.1 T to about 10 T, such as about 1 T to about 5 T. The degree of compression of each axis of each of the flow assemblies 200, 225, 250, 275 allows for shape tunability of the radicals 202. The flow assemblies 200, 225, 250, and 275 constrict a majority of the radicals 202 to a center of the substrate 210. The shape of the gas radicals 202 at the substrate 210 is a variable that can determine many on-substrate 210 process properties. As such, controlling the shape of the gas radicals 202 is beneficial to meeting various on-substrate 210 process requirements for different applications. Without compressing the shape of the radicals 202, such low flow rates may lack the required velocity to reach the center of the thin substrates 210, failing to meet a desired uniformity profile of the substrate 210.

Figure 2A:
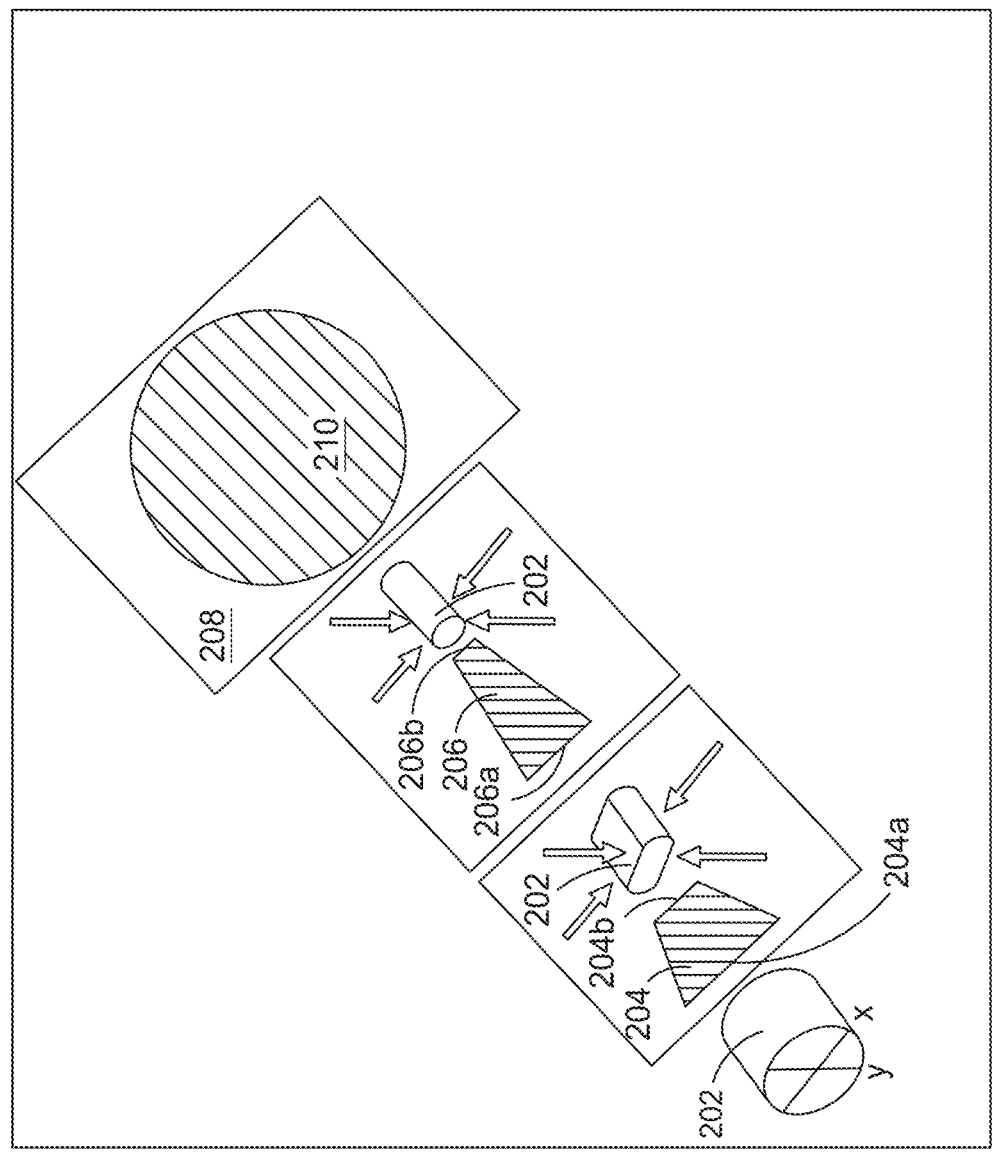
FIGS. 2A-2D illustrate various flow assemblies, according to various embodiments.

FIG. 2A illustrates a first embodiment of a flow assembly 200, according to one embodiment. The flow assembly 200 comprises a first compression part 204 extending from a plasma source (not shown), which may be the precursor activator 180 of FIGS. 1A-1B, to a second compression part 206. The second compression part 206 extends to a reactor or chamber 208, which may be the chamber body 108 of FIGS. 1A-1B. The first and second compression parts 204, 206 are hollow or tunnel-like. The first and second compression parts 204, 206 may each individually comprise quartz or sapphire, for example. A first opening 204a of the first compression part 204 is removably coupled to a port of the plasma source, and a second opening 204b of the first compression part 204 is removably coupled to a first opening 206a of the second compression part 206. A second opening 206b of the second compression part 206 is removably coupled to the reactor 208. The first and second compression parts 204, 206 are removably coupled to each other, the plasma source, and the reactor 208 to enable the first and second compression parts 204, 206 to be switched out or replaced as needed or desired. The first and second compression parts 204, 206 are each configured to compress radicals 202 in the x-direction and in the y-direction for radicals 202 flowing at a low flow rate. When the first and second compression parts 204, 206 are coupled together, the flow assembly 200 resembles the flow assembly 225 of FIG. 2B.

The first opening 204a of the first compression part 204 has the same size as an exit port of the plasma source. The second opening 204b of the first compression part 204 and the first opening 206a of the second compression part 206 are the same size to prevent gas radicals 202 from escaping. The first opening 204a of the first compression part 204 is larger than the second opening 204b. Similarly, the first opening 206a of the second compression part 206 is larger than the second opening 206b. The first and second compression parts 204, 206 may each be conical, circular, oval, or oblong (or a combination thereof) in shape.

The first compression part 204 has greater dimensions (e.g., a greater cross sectional area orthogonal to a direction of gas flow, as well as a greater volume) than the second compression part 206, and thus, the second compression part 206 compresses the radicals 202 a greater amount than the first compression part 204. The rate of compression is determined empirically. The first opening 204a of the first compression part 204 has a width in the x-direction of about 1 inch (in) to about 3 in and a height in the y-direction of about 1 in to about 3 in, and the second opening 204b has a width in the x-direction of about 0.1 in to about 5 in and a height in the y-direction of about 0.1 in to about 3 in. The first compression part 204 has a length in the z-direction of about 0.5 in to about 5 in. The first opening 206a of the second compression part 206 has a width in the x-direction of about 0.1 in to about 5 in and a height in the y-direction of about 0.1 in to about 3 in, and the second opening 206b has a width in the x-direction of about 0.1 in to about 5 in and a height in the y-direction of about 0.1 in to about 3 in. The second compression part 206 has a length in the z-direction of about 0.5 in to about 5 in. The dimensions of the first and second compression parts 204, 206 result in the radicals 202 being compressed about 50% to about 90% from an initial cross-sectional area of the port of the plasma source or the first opening 204a of the first compression part 204.

As gas radicals 202 flow from the plasma source into the first compression part 204 in the z-direction, the first compression part 204 gradually compresses the radicals 202 in the x-direction and the y-direction, as shown by the arrows, decreasing the overall volume occupied by the radicals 202. When the radicals 202 flow into the second compression part 206, the second compression part 206 further gradually compresses the radicals 202 in the x-direction and the y-direction, as shown by the arrows, to achieve a final desired volumetric shape. After the volume occupied by the gas radicals 202 is compressed by the second compression part 206, the radicals 202 having a low-flow rate enter the reactor 208 and flow towards a center of the substrate 210. While the radicals 202 are shown to occupy a circular volume upon being compressed by the second compression part 206, the radicals 202 may occupy a circular, oval or oblong shape, as discussed below in FIGS. 3A-3D. Using the flow assembly 200, the shape of the radical volume has a high tunablility, as the degree of compression and flow distribution can be adjusted to tune substrate non-uniformity. Furthermore, the tunability is increased in the flow assembly 200, as the first and second compression parts 204, 206 can be switched out or changed individually as desired, to accommodate changes in process parameters and maintain processing uniformity.

Figure 2B:
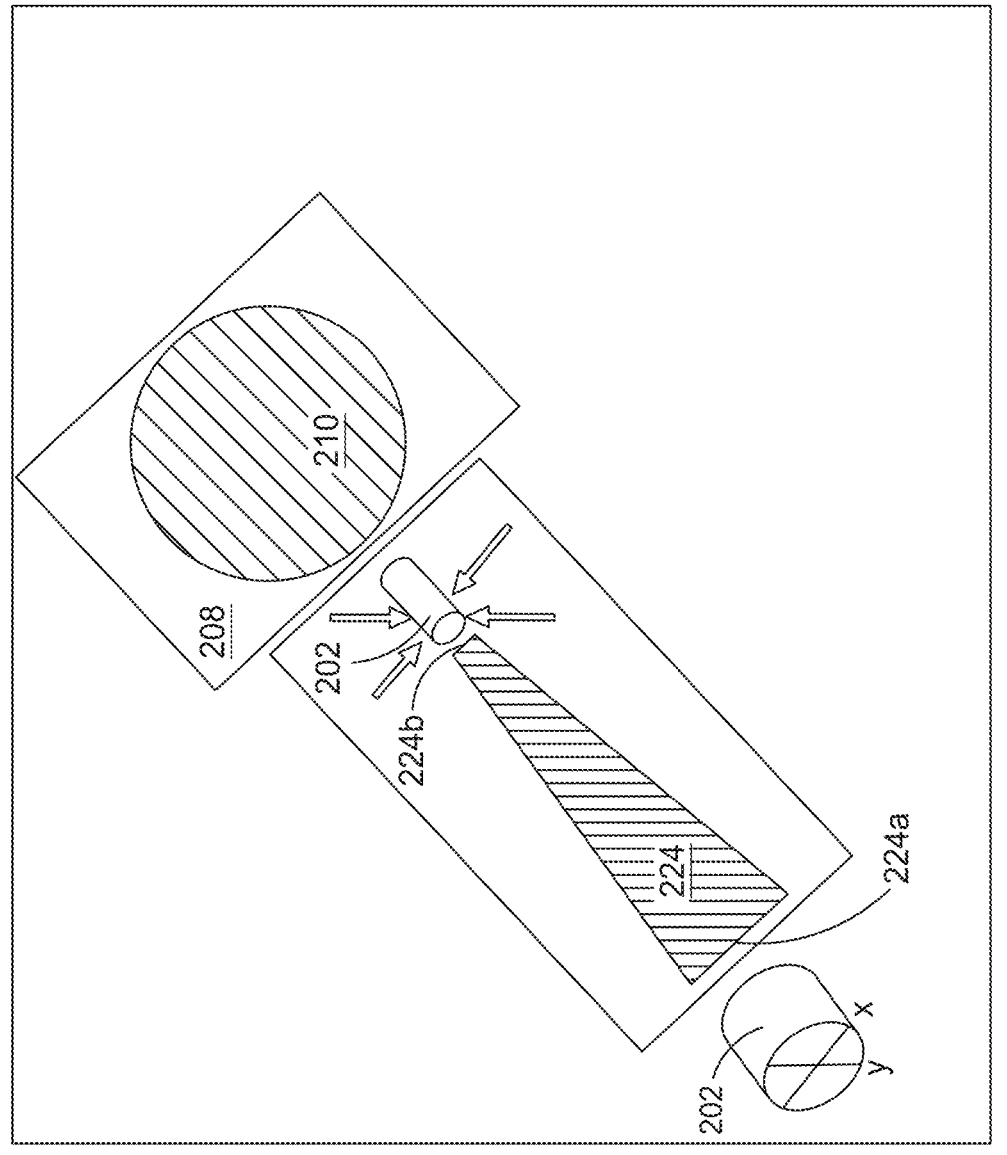

FIG. 2B illustrates a second embodiment of a flow assembly 225, according to another embodiment. The flow assembly 225 is similar to the flow assembly 200 of FIG. 2A; however, the flow assembly 225 comprises a single compression part 224. The compression part 224 extends from the port of the plasma source to the reactor 208, where a first opening 224a of the compression part 224 is removably coupled to the plasma source and a second opening 224b of the compression part 224 is removably coupled to the reactor 208. The first opening 224a of the first compression part 204 has the same size as an exit port of the plasma source, and the second opening 224b has a smaller size than an entry port of the chamber 208. The compression part 224 is hollow or tunnel-like, and may be conical, circular, oval, or oblong (or a combination thereof) in shape. The compression part 224 is configured to compress radicals 202 in both the x-direction and the y-direction to reduce the flow rate of the radicals 202. The degree of compression of each axis of the compression part 224 allows for shape tunability of the volumetric flow of radicals 202. Volumetric flow shapes of the radicals 202 are selected to achieve desired non-uniformity of substrate 210, particularly at lower flow rates (e.g., a flow rate from about 0.1 slm to about 5 slm).

The first opening 224a is larger than the second opening 224b, where the first opening 224a has a width in the x-direction of about 1 in to about 3 in and a height in the y-direction of about 1 in to about 3 in, and the second opening 224b has a width in the x-direction of about 0.1 in to about 5 in and a height in the y-direction of about 0.1 in to about 3 in. The compression part 224 has a length in the z-direction of about 1 in to about 10 in. The dimensions of the first and second compression parts 204, 206 result in the radicals 202 being compressed about 60% to about 99% from an initial cross-sectional area of the port of the plasma source or the first opening 224a of the first compression part 224.

Like the flow assembly 200 of FIG. 2A, as gas radicals 202 flow from the plasma source into the first opening 224a of the compression part 224 in the z-direction, the compression part 224 gradually compresses the radicals 202 in the x-direction and the y-direction, as shown by the arrows, decreasing the overall volume occupied by the radicals 202 to achieve a final desired volumetric shape to be output through the second opening 224*b*. After the volume occupied by the gas radicals 202 is compressed by the compression part 224, the radicals 202 having a low-flow rate enter the reactor 208 and flow towards a center of the substrate 210. While the radicals 202 are shown to occupy a circular volume upon being compressed by the second compression part 206, the radicals 202 may occupy a circular, oval or oblong shape, as discussed below in FIGS. 3A-3D. Using the flow assembly 225, the shape of the radical volume has a high tunablility, as the degree of compression and flow distribution can be adjusted to achieve a desired non-uniformity of substrates.

Figure 2C:
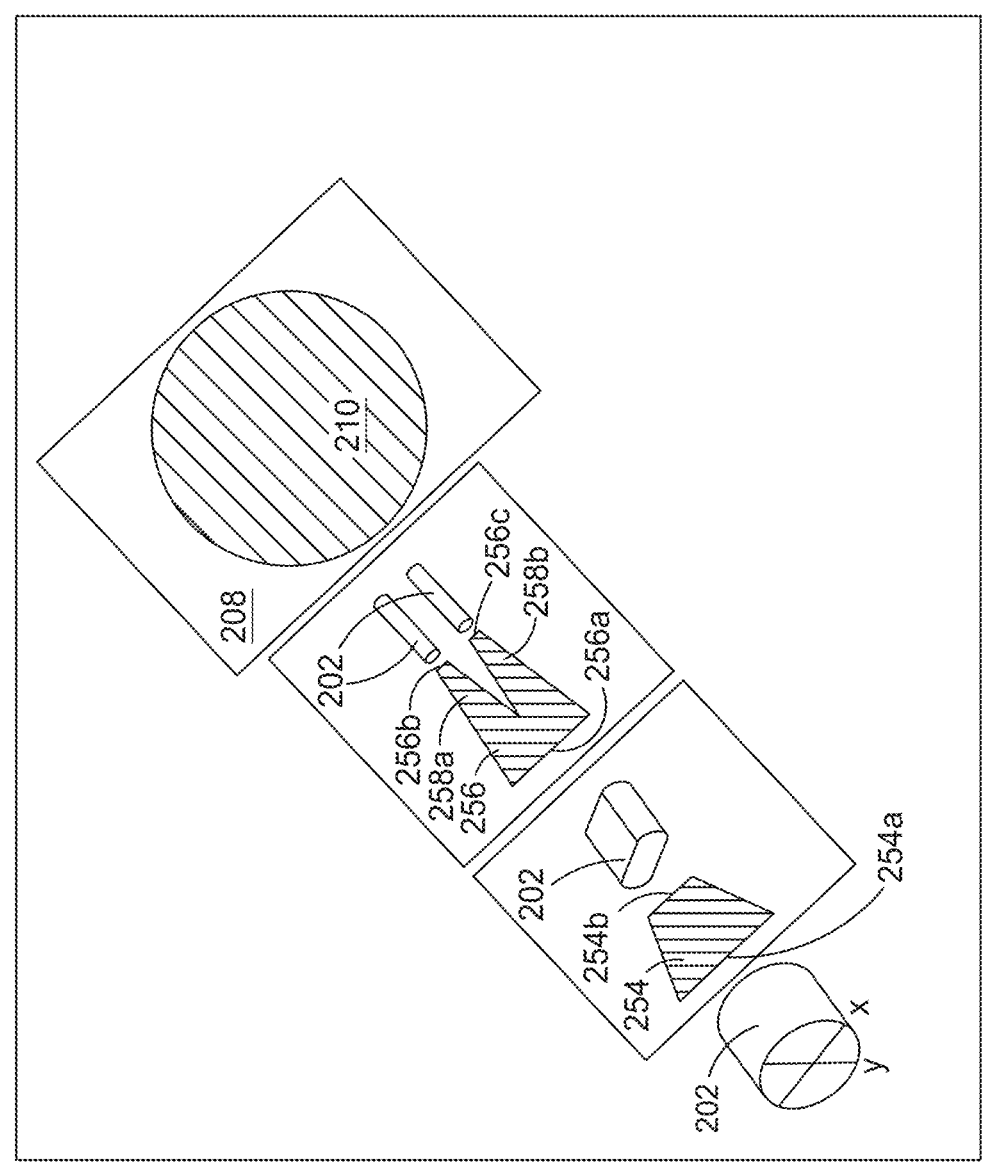

FIG. 2C illustrates a second embodiment of a flow assembly 250, according to yet another embodiment. The flow assembly 250 is similar to the flow assembly 200 of FIG. 2A; however, a second compression part 256 of the flow assembly 250 comprises a first leg 258*a* and a second leg 258*b*. In some embodiments, the first compression part 254 may be the first compression part 204 of FIG. 2A. The first and second compression parts 254, 256 may be utilized with or switched for the first and second compression parts 204, 206 of the flow assembly 200 of FIG. 2A.

The first and second compression parts 254, 256 are hollow or tunnel-like. A first opening 254*a* of the first compression part 254 is removably coupled to the port of the plasma source, and a second opening 254*b* of the first compression part 204 is removably coupled to a first opening 256*a* of the second compression part 256. A second opening 256*b* of the first leg 258*a* and a third opening 256*c* of the second leg 258*b* of the second compression part 256 are each removably coupled to the reactor 208. The first and second compression parts 254, 256 are removably coupled to each other, the plasma source, and the reactor 208 to enable the first and second compression parts 254, 256 to be switched out or replaced as needed or desired. The first opening 254*a* of the first compression part 254 has the same size as an exit port of the plasma source, and the second and third openings 254*b*, 254*c* each have the same size as entry ports of the chamber 208. When the first and second compression parts 254, 256 are coupled together, the flow assembly 200 resembles the flow assembly 275 of FIG. 2D.

The first opening 254*a* of the first compression part 254 has the same size as an exit port of the plasma source. The second opening 254*b* of the first compression part 254 and the first opening 256*a* of the second compression part 256 are the same size to prevent gas radicals 202 from escaping. The first opening 254*a* of the first compression part 254 is larger than the second opening 254*b*. Similarly, the first opening 256*a* of the second compression part 256 is larger than the second and third openings 256*b*, 256*c*. The first and second compression parts 254, 256 may each be conical, circular, oval, or oblong (or a combination thereof) in shape. The first and second compression parts 254, 256 are each configured to compress radicals 202 in the x-direction and in the y-direction to reduce the flow rate of the radicals 202. The degree of compression of each axis of each of the first and second compression parts 204, 206 allows for shape tunability of the radicals 202.

The first compression part 254 has greater dimensions than the second compression part 206, and thus, the second compression part 256 compresses the radicals 202 a greater amount than the first compression part 254. The first opening 254*a* of the first compression part 254 has a width in the x-direction of about 1 in to about 3 in and a height in the y-direction of about 1 in to about 3 in, and the second opening 254*b* has a width in the x-direction of about 0.1 in to about 5 in and a height in the y-direction of about 0.1 in to about 3 in. The first compression part 254 has a length in the z-direction of about 0.5 in to about 5 in. The first opening 256*a* of the second compression part 256 has a width in the x-direction of about 0.1 in to about 5 in and a height in the y-direction of about 0.1 in to about 3 in. The second and third openings 256*b*, 256*c* each individually has a width in the x-direction of about 0.1 in to about 3 in and a height in the y-direction of about 0.1 in to about 3 in. The first and second legs 258*a*, 258*c* of the second compression part 256 each individually has a length in the z-direction of about 0.5 in to about 4.5 in, and the second compression part 256 has a total length in the z-direction of about 1 in to about 5 in. The dimensions of the first and second compression parts 204, 206 result in the radicals 202 being compressed about 50% to about 90% from an initial cross-sectional area of the port of the plasma source or the first opening 254*a* of the first compression part 254.

As gas radicals 202 flow from the plasma source into the first compression part 254 in the z-direction, the first compression part 254 gradually compresses the radicals 202 in the x-direction and the y-direction, decreasing the overall volume occupied by the radicals 202. When the radicals 202 flow into the second compression part 256, the second compression part 256 further gradually compresses the radicals 202 in the x-direction and the y-direction to achieve a final desired volumetric shape. After the volume occupied by the gas radicals 202 is compressed by the second compression part 256, the radicals 202 having a low-flow rate enter the reactor 208 and flow towards a center of the substrate 210. While the radicals 202 are shown to occupy a circular volume upon being compressed by the second compression part 206, the radicals 202 may occupy a circular, oval or oblong shape, as discussed below in FIGS. 3A-3D. Using the flow assembly 250, the shape of the radical volume has a high tunablility, as the degree of compression and flow distribution can be adjusted to achieve more uniform substrate processing. Furthermore, the tunability is increased in the flow assembly 250, as the first and second compression parts 254, 256 can be switched out or changed individually as desired.

Figure 2D:
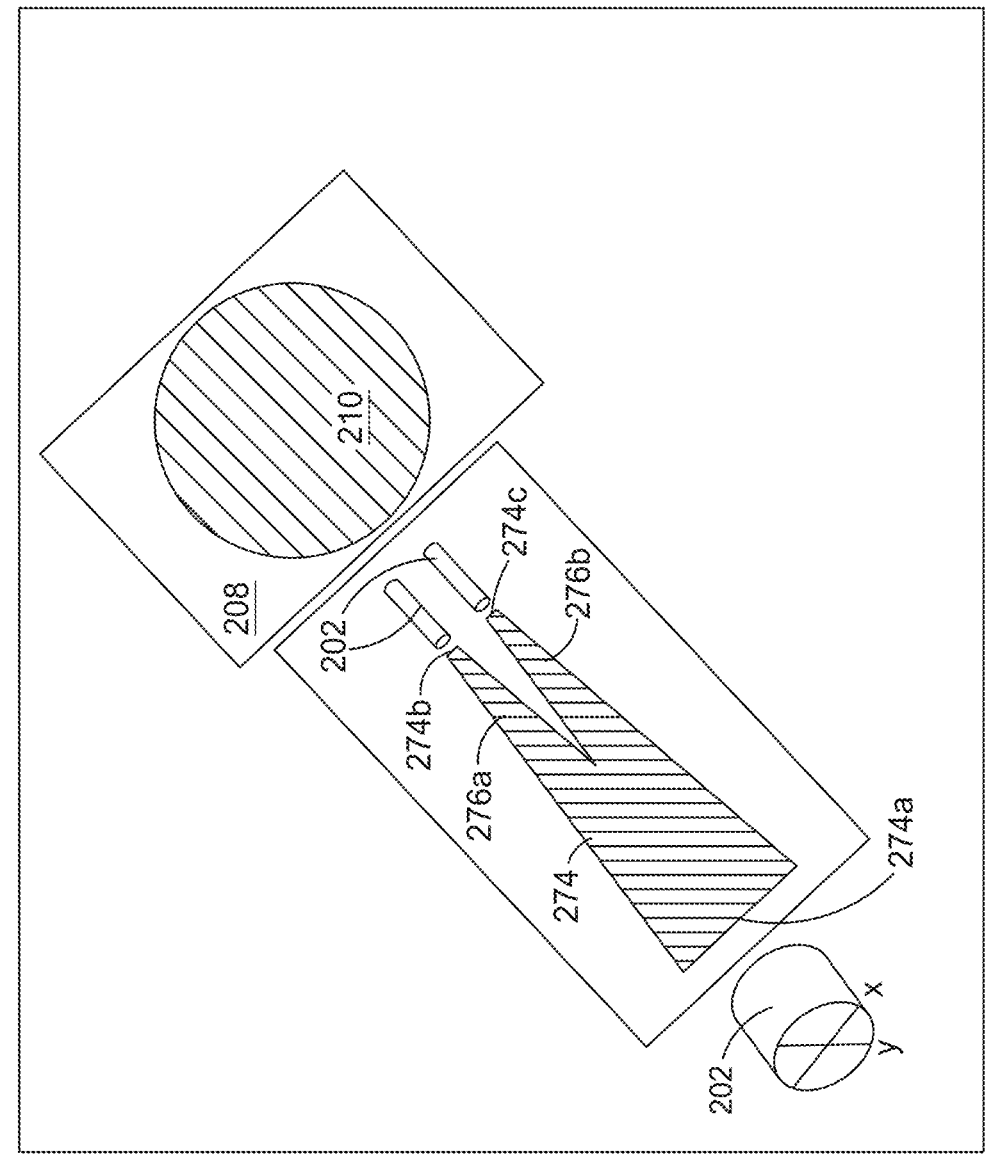

FIG. 2D illustrates a second embodiment of a flow assembly 275, according to another embodiment. The flow assembly 275 is similar to the flow assembly 200 of FIG. 2A and the flow assembly 250 of FIG. 2C; however, the flow assembly 275 comprises a single compression part 274 having a first leg 276*a* and a second leg 276*b*. The compression part 274 extends from the port of the plasma source to the reactor 208, where a first opening 274*a* of the compression part 274 is removably coupled to the plasma source and a second opening 274*b* of the first leg 276*a* and a third opening 274*c* of the second leg 278*b* of the compression part 274 are each removably coupled to the reactor 208. The first opening 274*a* of the first compression part 274 has the same size as an exit port of the plasma source, and the second and third openings 274*b*, 274*c* each have the same size as entry ports of the chamber 208. The compression part 274 is hollow or tunnel-like, and may be conical, circular, oval, or oblong (or a combination thereof) in shape. The compression part 274 is configured to compress radicals 202 in both the x-direction and the y-direction.

The first opening 274*a* is larger than the second and third openings 274*b*, 276*c*, where the first opening 274*a* has a width in the x-direction of about 1 in to about 3 in and a height in the y-direction of about 1 in to about 3 in. The second and third openings 274b, 274c each individually have a width in the x-direction of about 0.1 in to about 3 in and a height in the y-direction of about 0.1 in to about 3 in. The first and second legs 276a, 276b each have a length in the z-direction of about 0.5 in to about 9.5 in, and the compression part 274 has a total length in the z-direction of about 1 in to about 10 in. The dimensions of the compression part 274 result in the radicals 202 being compressed about 60% to about 99% from an initial cross-sectional area of the port of the plasma source first opening 274a of the first compression part 274.

As gas radicals 202 flow from the plasma source into the first opening 274a of the compression part 274 in the z-direction, the compression part 274 gradually compresses the overall volume occupied by the radicals 202 in the x-direction and the y-direction to achieve a final desired volumetric shape to be output through the second opening 224b. After the volume occupied by the gas radicals 202 is compressed by the compression part 274, the radicals 202 having a low-flow rate enter the reactor 208 and flow towards a center of the substrate 210. While the radicals 202 are shown to occupy a circular volume upon being compressed by the second compression part 206, the radicals 202 may occupy a circular, oval or oblong shape, as discussed below in FIGS. 3A-3D. Using the flow assembly 275, the shape of the radical volume has a high tunablility, as the degree of compression and flow distribution can be adjusted to achieve more uniform substrate processing.

FIGS. 3A-3D illustrate the compression tunability of gas radicals using one or more flow assemblies on FIGS. 2A-2D, according to various embodiments. While the second compression part 206 of the flow assembly 200 of FIG. 2A is shown, the second compression part 206 is merely illustrative, and the second compression part 206 may instead be the compression part 224 of the flow assembly 225 of FIG. 2B, the second compression part 256 of the flow assembly 250 of FIG. 2C, and/or the compression part 274 of the flow assembly 275 of FIG. 2D.

In FIGS. 3A and 3B, the compression part 206 is circular, and the volume occupied by the radicals 202 is compressed an equal amount in the x-direction and the y-direction, resulting in the radicals 202 being compressed into a circular volumetric shape. However, the volume occupied by the radicals 202 is compressed a greater amount in FIG. 3A than in FIG. 3B, as shown by the thickness of the arrows, resulting in the volumetric shape of the radicals 202 shown in FIG. 3A having a smaller circumference and volume than the radicals 202 shown in FIG. 3B.

In FIG. 3C, the compression part 206 is oblong in shape. As such, the volume occupied by the radicals 202 is compressed a greater amount in the x-direction than in the y-direction, as shown by the thickness of the arrows, resulting in the volumetric shape of the radicals 202 having a greater height in the y-direction than a thickness in the x-direction. Similarly, in FIG. 3D, the compression part 206 is oblong in shape, and the volume occupied by the radicals 202 is compressed a greater amount in the y-direction than in the x-direction, as shown by the thickness of the arrows, resulting in the volumetric shape of the radicals 202 having a greater thickness in the x-direction than a height in the y-direction. Thus, the volumetric shape of the compression parts of the various flow assemblies can be tuned as desired in order to process substrates as needed.

Therefore, utilizing a flow assembly configured to compress the volume occupied by gas radicals in two dimensions, such as in x-direction and in the y-direction, enables the volumetric shape of the radicals to be compressed as needed to properly process thin substrates using low flow rates. The degree of compression of each axis of the flow assembly allows for volumetric shape tunability of the radicals. The volumetric shape of the gas radicals at the substrate is a variable that can determine many on-substrate process properties. As such, controlling the volumetric shape of the gas radicals is beneficial to meeting various on-substrate process requirements for different applications.

While the foregoing is directed to embodiments of the present disclosure, other and further embodiments of the disclosure may be devised without departing from the basic scope thereof, and the scope thereof is determined by the claims that follow.

What is claimed is:

1. A flow assembly configured to extend between a plasma source and a chamber, the flow assembly comprising:
   a first compression part having a first opening coupled to a port of the plasma source and a second opening opposite the first opening, the second opening being smaller than the first opening; and
   a second compression part having a first opening coupled to the second opening of the first compression part and a second opening opposite the first opening coupled to the chamber, the second opening of the second compression part being smaller than the first opening of the second compression part, wherein the first and second compression parts are configured to compress a volume occupied by gas radicals flowing from the plasma source to the chamber in two dimensions.

2. The flow assembly of claim 1, wherein the first and second compression parts are each individually removable.

3. The flow assembly of claim 1, wherein the first and second compression parts are each individually conical, circular, oval, or oblong in shape.

4. The flow assembly of claim 1, wherein the second compression part comprises a first leg and a second leg, the first leg comprising the second opening of the second compression part.

5. The flow assembly of claim 4, wherein the second leg comprises a third opening having the same size as the second opening.

6. The flow assembly of claim 1, wherein the first and second compression parts compress the volume occupied by the gas radicals about 50% to about 90% from an initial cross-sectional area of the first opening of the first compression part.

7. The flow assembly of claim 1, wherein the gas radicals have a flow rate between about 0.1 slm to 5 slm when being compressed by the first and second compression parts.

8. A processing system, comprising:
   a plasma source;
   a chamber; and
   a flow assembly configured to extend between the plasma source and the chamber, the flow assembly comprising:
      a first compression part having a first opening coupled to a port of the plasma source and a second opening opposite the first opening, the second opening being smaller than the first opening; and
      a second compression part having a first opening coupled to the second opening of the first compression part and a second opening opposite the first opening coupled to the chamber, the second opening of the second compression part being smaller than the first opening of the second compression part, wherein the first and second compression parts are configured to compress a volume occupied by gas radicals flowing from the plasma source to the chamber in two dimensions.

9. The processing system of claim 8, wherein the first and second compression parts are each individually removable.

10. The processing system of claim 8, wherein the first and second compression parts are each individually conical, circular, oval, or oblong in shape.

11. The processing system of claim 8, wherein the second compression part comprises a first leg and a second leg, the first leg comprising the second opening of the second compression part.

12. The processing system of claim 11, wherein the second leg comprises a third opening having the same size as the second opening.

13. The processing system of claim 8, wherein the first and second compression parts compress the volume occupied by the gas radicals about 50% to about 90% from an initial cross-sectional area of the first opening of the first compression part.

14. The processing system of claim 8, wherein the gas radicals have a flow rate between about 0.1 sim to 5 slm when being compressed by the first and second compression parts.

15. A processing system, comprising:
   a plasma source;
   a chamber; and
   a flow assembly configured to extend between the plasma source and the chamber, the flow assembly comprising:
      a first compression part having a first opening coupled to a port of the plasma source and a second opening opposite the first opening, the second opening being smaller than the first opening; and a second compression part having a first opening coupled to the second opening of the first compression part and a second opening opposite the first opening coupled to the chamber, the second opening of the second compression part being smaller than the first opening of the second compression part, wherein the second opening of the first compression part and the first opening of the second compression part have the same size, and wherein the first and second compression parts are configured to compress a volume occupied by gas radicals flowing at a rate of about 0.1 slm to 5 slm from the plasma source to the chamber in two dimensions.

16. The processing system of claim 15, wherein the first and second compression parts are each individually removable.

17. The processing system of claim 15, wherein the first and second compression parts are each individually conical, circular, oval, or oblong in shape.

18. The processing system of claim 15, wherein the second compression part comprises a first leg and a second leg, the first leg comprising the second opening of the second compression part.

19. The processing system of claim 18, wherein the second leg comprises a third opening having the same size as the second opening.

20. The processing system of claim 15, wherein the first and second compression parts compress the volume occupied by the gas radicals about 50% to about 90% from an initial cross-sectional area of the first opening of the first compression part.

*     *     *     *     *